United States Patent
Weidman et al.

(10) Patent No.: US 8,440,571 B2
(45) Date of Patent: May 14, 2013

(54) METHODS FOR DEPOSITION OF SILICON CARBIDE AND SILICON CARBONITRIDE FILMS

(75) Inventors: Timothy W. Weidman, Sunnyvale, CA (US); Todd Schroeder, Toledo, OH (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/288,157

(22) Filed: Nov. 3, 2011

(65) Prior Publication Data

US 2012/0122302 A1 May 17, 2012

Related U.S. Application Data

(60) Provisional application No. 61/409,735, filed on Nov. 3, 2010, provisional application No. 61/534,122, filed on Sep. 13, 2011.

(51) Int. Cl.
*H01L 21/302* (2006.01)
(52) U.S. Cl.
USPC ............ 438/718; 438/767; 438/769; 438/779
(58) Field of Classification Search .................. 438/718, 438/767–769, 779
See application file for complete search history.

(56) References Cited

U.S. PATENT DOCUMENTS

| | | | |
|---|---|---|---|
| 5,153,295 A * | 10/1992 | Whitmarsh et al. ............. | 528/31 |
| 6,225,238 B1 * | 5/2001 | Wu ................................. | 438/778 |
| 6,730,802 B2 | 5/2004 | Shen et al. | |
| 2004/0063984 A1 | 4/2004 | Shen et al. | |
| 2004/0115876 A1 | 6/2004 | Goundar et al. | |
| 2007/0277734 A1 | 12/2007 | Lubomirsky et al. | |
| 2009/0155606 A1 | 6/2009 | Yoon et al. | |
| 2010/0003406 A1 | 1/2010 | Lam et al. | |
| 2010/0129994 A1 | 5/2010 | Awad et al. | |

FOREIGN PATENT DOCUMENTS

| | | |
|---|---|---|
| JP | 2003/179054 | 6/2003 |
| KR | 2009/0121361 | 11/2009 |
| WO | WO-95/10638 | 4/1995 |

OTHER PUBLICATIONS

PCT International Search Report and Written Opinion in PCT/US2011/059135, mailed Jul. 10, 2012, 12 pgs.
"PCT International Search Report and Written Opinion in PCT/US2012/054611", mailed on Feb. 28, 2013, 12 pages.
"Non-Final Office Action in U.S. Appl. No. 13/609,867", dated Mar. 15, 2013, 8 pgs.

* cited by examiner

*Primary Examiner* — Dung A. Le
(74) *Attorney, Agent, or Firm* — Servilla Whitney LLC

(57) ABSTRACT

Methods for deposition of silicon carbide films on a substrate surface are provided. The methods include the use of vapor phase carbosilane precursors and may employ plasma enhanced atomic layer deposition processes. The methods may be carried out at temperatures less than 600° C., for example between about 23° C. and about 200° C. or at about 100° C. This silicon carbide layer may then be densified to remove hydrogen content. Additionally, the silicon carbide layer may be exposed to a nitrogen source to provide reactive N—H groups, which can then be used to continue film deposition using other methods. Plasma processing conditions can be used to adjust the carbon, hydrogen and/or nitrogen content of the films.

15 Claims, 12 Drawing Sheets

METHODS FOR DEPOSITION OF SILICON CARBIDE AND SILICON CARBONITRIDE FILMS

CROSS-REFERENCE TO RELATED APPLICATION

This application claims priority to U.S. Provisional Application Nos. 61/409,735, filed Nov. 3, 2010, and 61/534,122, filed Sep. 13, 2011, the contents of which are hereby incorporated by reference in their entirety.

TECHNICAL FIELD

A first aspect of the present invention relates generally to methods of depositing silicon carbide layers or films on substrate surfaces. In particular embodiments of the first aspect, the invention relates to atomic layer deposition processes utilizing organosilane precursor compounds. A second aspect of the present invention pertains to apparatus and methods for plasma enhanced atomic layer deposition. In particular embodiments of the second aspect, the apparatus utilizes a showerhead or faceplate with dual channels to deliver a remotely generated plasma through a first set of channels and to deliver precursor and other gases through a second set of channels. In a third aspect, the methods of forming silicon carbide layers can be performed in the apparatus described according to the second aspect.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. One method for deposition of thin films with atomic layer control and conformal deposition is atomic layer deposition (ALD), which employs sequential, self-limiting surface reactions to form layers of precise thickness controlled at the Ångstrom or monolayer level. Most ALD processes are based on binary reaction sequences which deposit a binary compound film. Each of the two surface reactions occurs sequentially and because they are self-limiting a thin film can be deposited with atomic level control. Because the surface reactions are sequential, the two gas phase reactants are not in contact and possible gas phase reactions that may form and deposit particles are limited. The self-limiting nature of the surface reactions also allows the reaction to be driven to completion during every reaction cycle, resulting in films that are continuous and pinhole-free.

Atomic layer deposition may be used to form features in the manufacturing process of circuit devices such as semiconductors. A thin film is grown layer by layer by exposing a surface of the substrate disposed in a process chamber to alternating pulses of reactants or chemical precursors, each of which undergoes a reaction, generally providing controlled film thickness. Each reactant pulse provides an additional atomic layer to previously deposited layers. The film growth cycle generally consists of two pulses, each pulse being separated by a purge. The process chamber can be purged with an inert gas to remove the reactant or precursor material. When second reactant or precursor material is pulsed into the reactor, the second reactant or precursor material reacts with the precursor material on the wafer surface. The reactor is purged again with an inert gas. In an ALD manufacturing process, the thickness of the deposited film is controlled by the number of cycles.

Atomic layer deposition may also be referred to as cyclical deposition, referring to the sequential introduction of two or more reactive compounds to deposit a layer of material on a substrate surface. The two or more reactive compounds are alternatively introduced into a reaction zone or process region of a processing chamber. The reactive compounds may be in a state of gas, plasma, vapor, fluid or other state of matter useful for a vapor deposition process. Usually, each reactive compound is separated by a time delay to allow each compound to adhere, adsorb, absorb and/or react on the substrate surface. In typical ALD processes, a first precursor or compound A is pulsed into the reaction zone followed by a first time delay. Next, a second precursor or compound B is pulsed into the reaction zone followed by a second delay. Compound A and compound B react to form a deposited material. During each time delay, a purge gas is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle.

Silicon carbide ($Si_xC_yH_z$) and similar films are promising materials for a variety of applications. For example, in semiconductor devices some compositions of $Si_xC_yH_z$ functions at high temperature, high voltage and high frequency without degradation. Excellent mechanical, chemical, and electrical capabilities also make silicon carbide an attractive material in microelectromechanical systems (MEMS). Silicon carbide is considered an attractive material for EUV and soft X-ray optics, passivation layers in solar cells.

In addition to ALD, a variety of other techniques are used for deposition of silicon carbide thin films, including traditional chemical vapor deposition (CVD) and plasma enhanced CVD (PECVD). Improvements in existing processes as well as new deposition processes are desired. The present invention provides thin film deposition processes which may be conducted at relatively low temperatures with good conformality and deposition rates, low stress and high etch rate selectivity.

SUMMARY

One embodiment of the invention relates to a method for forming silicon carbide on a substrate surface comprising exposing a substrate having a reactive surface to a vapor phase carbosilane precursor to form a silicon carbide layer on the substrate surface, wherein the carbosilane precursor contains at least one carbon atom bridging at least two silicon atoms. Thus, one aspect of the present invention is directed to a method of forming a layer on a substrate surface, the method comprising providing a substrate, exposing the substrate surface to a carbosilane precursor containing at least one carbon atom bridging at least two silicon atoms, exposing the carbosilane precursor to a low-power energy source to provide a carbosilane at the substrate surface, densifying the carbosilane and exposing the carbosilane surface to a nitrogen source. In one embodiment of this aspect, densifying the carbosilane comprises exposing the substrate surface to a plasma containing one or more of He, Ar and $H_2$. In a different embodiment, the carbosilane precursor contains a methylene group bridging at least two silicon atoms. In a more specific embodiment, the carbosilane is one or more of 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane. In one variant of this embodiment, the carbosilane precursor is 1,3,5-trisilapentane.

In another embodiment of this aspect, exposing the carbosilane to a nitrogen source comprises exposing the carbosilane to a plasma containing nitrogen. In a more specific version of this embodiment, exposing the carbosilane to a plasma containing nitrogen results in the formation of N—H bonds that promote irreversible attachment of a monolayer of the carbosilane to the substrate surface. Alternatively, in a different embodiment, exposing the carbosilane to a nitrogen source comprises flowing ammonia. In one embodiment, this aspect further comprises exposing the substrate surface to a second precursor containing a silicon-to-halogen or silicon-to-pseudohalogen bond.

In another embodiment of this aspect, exposing the carbosilane precursor to a low-power energy source comprises exposing the carbosilane precursor to an electron beam. In an alternative embodiment, exposing the carbosilane precursor to a low-power energy source comprises exposing the carbosilane precursor to a low-power plasma. In a more specific variant of this embodiment, exposing the carbosilane precursor to a low-power plasma results in polymerization of the carbosilane. In a different embodiment, the low-power plasma has a value of about 10 W to about 200 W. In yet a different embodiment, the carbosilane precursor is exposed to the low-power plasma for about 0.10 seconds to about 5.0 seconds.

To effect the densification of intermediate surface bound carbosilane-based monolayers to SiC, the substrate surface may be treated with a plasma effective for removing hydrogen atoms. Typical gas mixtures suitable for such purposes can include H2, inert gases such as He and Ar, or most often mixtures thereof. Both hydrogen ions and radical species generated in such plasmas are particularly efficient and selective at combining with hydrogen atoms bound to Si or C in the film resulting in loss of $H_2$ and crosslinking. After purging, the plasma-treated silicon carbide intermediate can be re-exposed to additional carbosilane precursor in gas phase to form an additional adsorbed layer. If targeting SiCN, an additional plasma step using a gas mixture incorporation Nitrogen ($N_2$) can be introduced into the sequence before adding additional silicon carbide layers. Cycles of plasma activation and silicon carbide gas exposure may be repeated until the desired layer thickness is achieved. Carbosilane precursors useful in the deposition processes may be linear or cyclic carbosilanes (i.e. compounds possessing alternating backbones of carbon and silicon atoms). Examples include, without limitation, 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane.

In a further embodiment, the invention provides a method for forming silicon carbide on a substrate surface comprising treating the substrate surface with a plasma to activate the surface, exposing the treated substrate surface to a vapor phase carbosilane compound to form a silicon carbide layer on the substrate surface, wherein the vapor phase silicon carbide contains at least one carbon bridging at least two silicon atoms, treating the silicon carbide layer with a plasma to activate the silicon carbide layer, and exposing the treated silicon carbide layer to the vapor phase carbosilane precursor to form an additional silicon carbide layer on the substrate surface. Such plasma may be effective for removing hydrogen atoms. Again, typical gases suitable include, but are not limited to, hydrogen gas, inert gases (e.g., He, Ar, etc.) and mixtures thereof. If further additional silicon carbide layers are desired, gas phase silicon carbide may be purged and the plasma treatment and silicon carbide exposure steps may be repeated until the desired layer thickness is obtained. The vapor phase carbosilane precursor in subsequent deposition cycles may be the same as or different than the carbosilane precursor deposited in prior cycles. It may also be desirable to purge the surface activating plasma before exposing the reactive surface to the vapor phase carbosilane precursor, and to purge the silicon carbide layer activating plasma before deposition of additional layers. In certain embodiments, the carbosilane precursor may be linear or cyclic.

In a specific embodiment of the invention, the vapor phase carbosilane precursor compound is 1,3,5 trisilacyclohexane. In this embodiment the method for forming silicon carbide on a substrate surface comprises, in a deposition chamber, exposing a substrate having a reactive surface to vapor phase 1,3,5-trisilacyclohexane to form a silicon carbide layer on the substrate surface, purging 1,3,5-trisilacyclohexane from the deposition chamber, exposing the silicon carbide layer to a plasma to activate the silicon carbide layer, purging the plasma from the deposition chamber, and exposing the activated silicon carbide layer to vapor phase 1,3,5 trisilacyclohexane to form an additional silicon carbide layer on the substrate surface. If desired, further additional silicon carbide layers may be formed by repeating the plasma activation and silicon carbide deposition steps, typically with purges between plasma activation and silicon carbide deposition steps. Alternatively, the carbosilane precursor deposited on the 1,3,5-trisilacyclohexane layer may be any other carbosilane precursor. In a specific embodiment, the deposition of a SiCN-based film is carried out using a precursor comprising 1,3,5-trisilapentane. This precursor has sufficient vapor pressure at room temperature to allow facile delivery in either vapor draw ampoule or bubbler configurations (without heating). Additionally, the abundance of reactive Si—H bonds (two terminal —$SiH_3$ groups and one bridging —$SiH_2$— group) allows for the facile introduction of additional heteroatoms such as nitrogen.

In certain embodiments, any of the foregoing processes may be conducted at temperatures below 600° C. In more specific embodiments the processes may be conducted at temperatures between room temperature (about 23° C.) and 200° C. or at about 100° C.

DETAILED DESCRIPTION

Figure 1:
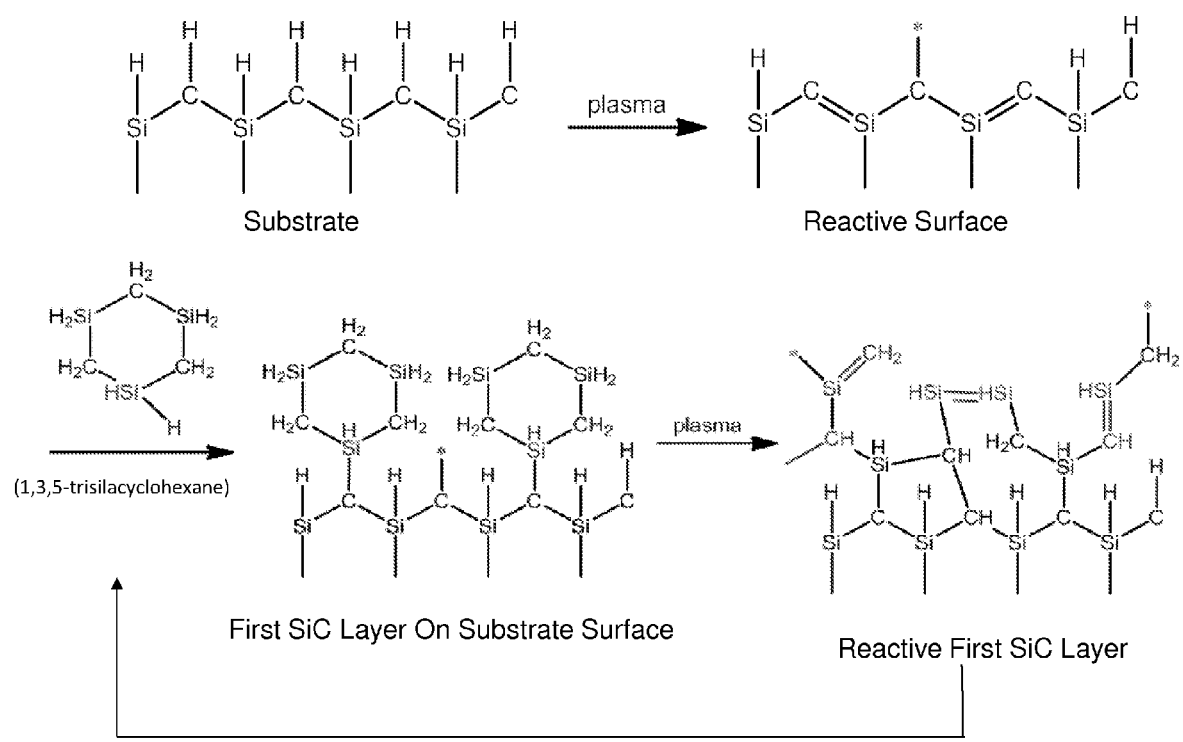
FIG. 1 illustrates an exemplary process within the scope of the invention, wherein the precursor 1,3,5-trisilacyclohexane is used for deposition of silicon carbide layers.

Before describing several exemplary embodiments of the invention, it is to be understood that the invention is not limited to the details of construction or process steps set forth in the following description. The invention is capable of other embodiments and of being practiced or being carried out in various ways.

As used herein, an "SiH-containing precursor" refers to a precursor molecule that contains a plurality of Si—H bonds. SiH-containing precursors include silanes and carbosilanes. The term "silanes" refers to compounds which contain silicon and hydrogen atoms, including silicon-to-hydrogen bonds. The term "carbosilanes," which may be used interchangeably with "organosilanes," refers to compounds that contain silicon, hydrogen and carbon atoms, and contain at least one carbon-to-silicon covalent bond.

As used herein the terms "carbosilane precursor" or "silicon carbide precursor" and their equivalents refer to organosilicon compounds containing at least one Si—C bond. In specific embodiments of the invention, the carbosilane precursor contains a carbon atom in a bridging position between at least two silicon atoms. As used herein, "containing at least one carbon atom bridging at least two silicon atoms" or "containing at least one carbon atom in a bridging position between at least two silicon atoms" refers to a carbosilane that contains an Si—C—Si component. The carbon may have two hydrogens, which would constitute a methylene group and result in a Si—CH$_2$—Si component. The silicon atoms may have a wide variety of substituents, including, but not limited to, hydrogen or additional silicon and/or carbon atoms. In some specific embodiments, the carbon atom may bridge three or four silicon atoms.

Silicon carbide referred to herein may be represented by the formula Si$_x$C$_y$H$_z$ wherein each of x, y and z is at least 1 and the compound contains at least one Si—H bond. Carbosilane precursors wherein x is at least two may incorporate bridging methylene units (—Si—CH$_2$—Si—) in which the carbon is bonded to two different Si atoms, as discussed above. The compounds may be linear carbosilanes or cyclic carbosilanes. In specific examples of linear carbosilane precursors, x is 1-6, y is 1-6 and z is 1-26. In specific examples, cyclic carbosilane precursors include 4-, 5- and 6-member rings such as silacyclobutanes, silacyclopentanes and silacyclohexanes. Specific carbosilane precursors, include without limitation, 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane.

As used herein, the terms "reactive surface," "activated surface," "activated silicon carbide layer" and their equivalents refers to a substrate surface or layer treated to promote hydrogen abstraction which can result in a more reactive or "unsaturated" surface. This may be accomplished, for example, by a plasma treatment. The plasma, for example, may be a hydrogen plasma or an inert gas plasma (e.g., helium, argon, neon or xenon). It can also include use of a gas mixture incorporating N$_2$, which may result in the incorporation of some nitrogen into the depositing film. Generation of the reactive or activated surface or layer provides active sites for attachment of the carbosilane precursor to the surface or layer. The reactive or activated surface or layer may include as active sites dangling Si bonds, Si=Si double bonds, Si=C double bonds, nitrogen inserted into Si—H bonds or nitrogen inserted into Si—Si bonds.

As used herein, the term "substrate surface" or its equivalent refers to any material upon which film processing is performed during a fabrication process. For example, substrate surfaces on which processing can be performed include silicon, silicon oxide and silicon carbide.

As used herein, "low-power energy source" refers to a source of energy that will not damage a silicon carbide film deposited at a substrate surface. Examples include ultraviolet, electron beam and ion beam. For example, where the source of energy is a plasma, the RF value is less than about 200 W.

Embodiments of the invention provide methods for selective depositing or forming silicon carbide, and in some cases, silicon carbonitride, on a substrate in a vapor deposition process at low temperatures using carbosilane precursors. Such methods include, for example, atomic layer deposition (ALD), plasma-enhanced ALD (PE-ALD), chemical vapor deposition (CVD), or plasma-enhanced CVD (PE-CVD). In ALD and PE-ALD, a processing chamber is configured to allow sequential exposure of the substrate to a series of vapor phase precursors and/or plasmas during the vapor deposition process.

The precursors used in various embodiments of the invention are carbosilane precursors containing at least one carbon atom bridging at least one silicon atom. For example, the precursor may contain bridging methylene units (—Si—CH$_2$—Si—) in which the carbon is bonded to two different Si atoms. In a specific embodiment, the precursor contains more than one bridging methylene unit. During subsequent plasma activation steps, such precursors have been found to undergo selective dehydrogenative condensation to silicon carbide, even at relatively low temperatures (for example, at 100° C.) and plasma densities. In contrast, methylsilane-based precursors may be more prone to plasma reactions involving Si—C bond cleavage. An additional key attribute associated with carbosilane based precursors which contain backbones comprised of alternating Si—C—Si—C— bonds, is that they facilitate the use of simple and efficient direct plasma based strategies for introducing heteroatoms. For example, nitrogen may be incorporated (by exposure to brief N$_2$ plasma) with minimal loss of carbon. Analogous treatment of methylsilane based precursors effects nearly complete replacement of the carbon by nitrogen. In alternative embodiments, remote plasma may be used in accordance with various embodiments of the invention.

In various embodiments, the carbosilane precursors is chosen such that there is reduced fragmenting in deposited films. Fragmentation of the film to volatile fragments prevents densification, and causes shrinking and cracking in flowable applications. Higher carbosilanes with an extended Si—C—Si backbone are particularly suitable as they tend towards dehydrogenative densification reactions, instead of fragmentation. In another embodiment, the carbosilane contains a bridging $CH_2$ group or simple C atom between three or four silicon atoms respectively. Precursors without such bridging methylene groups, such as those initially containing only terminal methyl substituents may undergo rearrangements on plasma excitation to form methylene bridged carbosilanes and are thus also suitable, though in this case there may also be substantial cleavage of the Si—C bond of the Si—$CH_3$ substituent.

Accordingly, carbosilane precursors containing carbon in a bridging position between two silicon atoms can be consolidated to carbide-type ceramics with efficient retention of carbon. On the other hand, carbon is not retained to such extent where the precursor does not contain a bridging carbon atom. For example, precursors based on methylsilanes undergo consolidation with substantial loss of carbon.

In specific embodiments, carbosilane precursors containing at least one carbon atom bridging at least two silicon atoms are used to produce thin films of SiC. In some embodiments, these thin films of SiC can then be converted to SiCN by displacing some of the carbon atoms from the SiC. Carbosilane precursors, as described herein, are used to deposit a thin layer of a silicon-containing film. While not wishing to be bound by any particular theory, it is thought that the carbosilane is polymerized at the substrate surface after exposure to a low-power energy source. The carbosilane precursor is exposed to a low-power energy source, which forms a layer of the precursor on the substrate surface. In one embodiment, exposing the carbosilane precursor to a low-power energy source comprises exposing the carbosilane precursor to an electron beam. In another embodiment, exposing the carbosilane precursor to a low-power energy source comprises exposing the carbosilane precursor to a low-power plasma. In a specific embodiment, the low-power plasma has a value of about 10 W to about 200 W. In another embodiment, the precursor is exposed to the low-power plasma for between about 0.10 seconds and about 5.0 seconds.

Carbosilane precursors have been demonstrated to undergo efficient densification/dehydrogenation to silicon-rich SiC. Thus, according to various embodiment, carbosilane precursor at the substrate surface is at least partially densified/dehydrogenated. In one embodiment, densification/dehydrogenation is plasma-induced. A helium, argon and/or hydrogen-containing plasma may be used for dehydrogenation. In specific embodiments, dehydrogenation involves the use of plasma containing $H_2$.

In addition to densification/dehydrogenation, nitrogen may be introduced into the SiC layer by nitridation to form SiCN. This occurs by exposing the carbosilane surface to nitrogen source. In one embodiment, this comprises flowing ammonia. In an alternative embodiment, nitridation occurs via exposure to a nitriding plasma. In a more specific embodiment, this nitriding plasma comprises $N_2$. In yet another alternative embodiment, nitridation does not occur.

Thus, one aspect of the invention relates to a method of forming a layer on a substrate surface, the method comprising providing a substrate, exposing the substrate surface to a carbosilane precursor containing at least one carbon atom bridging at least two silicon atoms, exposing the carbosilane precursor to a low-power energy source to provide a carbosilane at the substrate surface, densifying the carbosilane, and exposing the carbosilane surface to a nitrogen source. The process then may be repeated to add additional layers. In one embodiment of this aspect, dehydrogenation and nitridation occur substantially simultaneously. By contrast, in another embodiment, dehydrogenation and nitridation occur sequentially.

In one or more embodiments, the PE-ALD processes include sequentially exposing a substrate with a reactive surface to chemical precursors or reactants in vapor phase including a first chemical precursor which comprises a vapor phase carbosilane precursor represented by the formula $Si_xC_yH_z$ wherein each of x, y and z is at least 1 and the compound contains at least one carbon bridging at least two silicon atoms. In a specific embodiment, at least one additional silicon carbide layer is produced by sequential exposure of the silicon carbide layer on the substrate surface to a reactant gas which is a plasma such as a hydrogen plasma, a nitrogen plasma or an inert gas plasma and subsequently exposing the activated silicon carbide layer to a vapor phase carbosilane precursor. These processes may be conducted at temperatures below 600° C., for example at temperatures between 23° C. and 200° C., between 80° and 150° C., or between 23° C. and 100° C.

ALD employs sequential, self-limiting surface reactions to form layers of precise thickness controlled at the Ångstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

Thus the sequences described here are not traditional PEALD processes in the sense that they are not self-limiting with respect to the application of the current silicon precursor, although they achieve ALD-like results. The deposited films achieve a high level of conformality. Additionally, self-limiting deposition can be achieved with the introduction of activating substituents (essentially good leaving groups) that would result in their reaction with surface N—H functionality generated in the final nitrogen plasma activation sequence.

While not wishing to be bound to any particular theory, it is thought that exposure to a nitrogen source induces nitrogen insertion into the Si—H bonds to yield N—H functionality on the surface. These N—H groups may then react with a halogenated or cyanated precursor in subsequent steps to achieve a self-limiting reaction.

These deposition processes can be accomplished using relatively low RF power conditions and at temperatures lower than previously available. In previous methods, higher temperatures of more than 500° C. were necessary. In specific embodiments, substrate temperature during deposition can be lower than about 200° C. In some embodiments, substrate temperature may be below 100° C.

Carbosilanes may be linear, branched or cyclic. A particularly suitable type of carbosilane is one that contains a bridging methylene groups between at least two silicon atoms, such that the carbon in the methylene group is bonded to the at least two silicon atoms. In a further embodiment, the methylene group bridges two silicon atoms. Either one, both, or neither of the two silicon atoms may be halogenated or pseudohalogenated. Higher carbosilanes with an extended Si—C—Si backbone are particularly suitable as they tend towards dehydrogenative densification reactions, instead of fragmentation. In another embodiment, the carbosilane contains a bridging $CH_2$ group or simple C atom between three or four silicon atoms respectively. Precursors without such bridging methylene groups, such as those initially containing only terminal methyl substituents may undergo rearrangements on plasma excitation to form methylene bridged carbosilanes and are thus also suitable, though in this case there may also be substantial cleavage of the Si—C bond of the Si—$CH_3$ substituent.

Polycarbosilanes containing more extended backbones of alternating Si—C—Si—C—Si bonds, such as 1,3,5-trisilapentane, are particularly preferable. Examples of suitable carbosilane precursors include, but are not limited to 1,3,5-trisilapentane, 1,3,5-trisilacyclohexane, 1,3-disilabutane, 1,3-disilapropane and 1,3-disilacyclobutane. In a particular embodiment, the carbosilane precursor is 1,3-disilabutane. In another particular embodiment, the carbosilane precursor is 1,3,5-trisilapentane. Where a desired level of carbon is desired and the precursor contains only terminal methyl substituents, it is generally necessary to begin with precursors possessing at least twice the Si:C ratio desired in the final film.

In a specific embodiment, a silicon carbide layer may be formed on the substrate surface by sequentially exposing the substrate to vapor phase 1,3,5-trisilacyclohexane to form a silicon carbide layer on the surface, exposing the silicon carbide layer to a plasma to activate the silicon carbide layer and forming an additional silicon carbide layer on the substrate surface by exposing the activated silicon carbide layer to vapor phase 1,3,5-trisilacyclohexane to form the additional layer. Unreacted vapor phase 1,3,5-trisilacyclohexane and excess plasma may be purged after reaction with the substrate surface or layer and prior to introduction of the next chemical precursor or reactant gas.

In another specific embodiment, a silicon carbide layer may be formed on the substrate surface by sequentially exposing the substrate to vapor phase 1,3,5-trisilapentane to form a silicon carbide layer on the surface, exposing the silicon carbide layer to a plasma to activate the silicon carbide layer and forming an additional silicon carbide layer on the substrate surface by exposing the activated silicon carbide layer to vapor phase 1,3,5-trisilapentane to form the additional layer. Unreacted vapor phase 1,3,5-trisilapentane and excess plasma may be purged after reaction with the substrate surface or layer and prior to introduction of the next chemical precursor or reactant gas.

Additionally, other activation strategies may be used in accordance with various embodiments of the invention. Such activation strategies include, but are not limited to, ultraviolet radiation, electron beam and/or ion beam.

In some cases, the conformality of films deposited using such low power plasma steps may be sufficiently conformal such that even after subsequent densification they may provide "ALD-like" conformality. A useful way to enhance such conformality is to employ a plasma activation step at the end of the activation sequence—such as one resulting in the formation of N—H bonds—that promotes the irreversible attachment of the first monolayer of precursor deposited in a low power plasma step, while subsequently deposited materials are bound reversibly, and may re-enter the gas phase and be purged away during a subsequent purge step. Accordingly, in one embodiment, exposing the carbosilane to a plasma containing nitrogen results in the formation of N—H bonds that promote irreversible attachment of a monolayer of the carbosilane to the substrate surface. While the final surface activation, applied immediately prior to the introduction of precursor but after a plasma densification, may be a step involving nitrogen plasma, it may also involve a non plasma step such as simple exposure of the surface to a flow of ammonia ($NH_3$).

Generally, exposure of "seed" films containing Si, C, and H to N containing plasmas is effective for generating films exhibiting N—H functionality as detectable by growth of a characteristic absorption between about 3200-3600 $cm^{-1}$ in the FTIR. Typical conditions entail pressures in the range of 0.5 Torr to 20 Torr and RF power levels (13.56 MHz, direct plasma) of between 25 W and 500 W, for example 100 W for a duration of 2 sec at a total pressure of 4 Torr and partial pressure of nitrogen between about 1 Torr and 3 Torr, the balance being He or Ar. In cases where the film being treated contains very little H (for example if a plasma process has already been performed to remove H) a small amount of hydrogen may also be added to the plasma mixture to promote the generation of more N—H bonding.

The ratio of silicon to carbon in the film may be adjusted, depending on the plasma power, exposure time and temperature. For example, the ratio of C:Si can readily be reduced in a SiCN composition by replacing carbon with nitrogen atoms using post-treatment plasmas. The ratio of C to Si may be increased by utilizing precursors containing a higher initial ratio. Generally, carbosilane precursors containing carbon in a bridging position between two silicon atoms can be consolidated to carbide-type ceramics with efficient retention of carbon. On the other hand, carbon is not retained to such extent where the precursor does not contain a bridging carbon atom. For example, precursors based on methylsilanes undergo consolidation with substantial loss of carbon.

Another aspect of the invention relates to exposure of the substrate surface to plasma as part of the process of forming the film or layer. The surface with bound SiH-containing precursor is exposed to a densification/dehydrogenation plasma. Suitable dehydrogenation plasmas include, but are not limited to, $H_2$, He and Ar. The surface is then exposed to a nitriding plasma. Suitable nitriding plasmas include, but are not limited to $N_2$ and ammonia. Exposure to the plasmas may be done substantially simultaneously or sequentially. Substantially simultaneous means that the substrate surface is exposed to both plasmas at the same time, with little exposure time to one plasma at a time. When done sequentially, the dehydrogenating plasma may first be applied, followed by the nitriding plasma. Any number of sequences may be used. In one embodiment, plasma exposure may occur in every step of the process. In another embodiment, plasma exposure may occur every other sequence. Subsequent exposure to a nitriding plasma results in conversion of the SiC film to SiCN.

Accordingly, in a second aspect of the invention, the invention relates to a method of forming a layer on a substrate surface, the method comprising providing a substrate, exposing the substrate surface to a carbosilane precursor containing at least one methylene bridging two silicon atoms, exposing the carbosilane precursor to a low-power plasma to provide a carbosilane at the substrate surface, densifying the carbosilane, and exposing the carbosilane surface to a nitrogen source. In one embodiment of this aspect, the low-power plasma has a value of about 10 W to about 200 W. In a different embodiment of this aspect, the carbosilane precursor is exposed to the low-power plasma for between 0.10 seconds and 5.0 seconds.

A third aspect of the invention relates to a method of forming a layer on a substrate surface, the method comprising providing a substrate, exposing the substrate surface to a carbosilane precursor containing at least one methylene bridging two silicon atoms, exposing the carbosilane precursor to a low-power plasma to provide a carbosilane at the substrate surface; densifying the carbosilane, wherein densifying the carbosilane comprises exposing the carbosilane to a plasma containing one or more of $H_2$, Ar and He, and exposing the carbosilane surface to plasma containing $N_2$.

The approaches of low temperature deposition of SiCN and SiC films described above may also be used for the deposition of extremely thin, defect-free and conformal films for applications outside of the electronics industry. Such applications include for the preparation of barrier and passivation layers. Additionally, the low temperature reactivity would make the processes applicable to the coating of organic substrates, including plant- and animal-derived tissues and materials.

The carbosilane precursor may be introduced to the substrate surface in a mixture with an inert carrier gas such as argon, xenon, neon or helium. The purge gas is also typically an inert gas. The plasma gas for activation of the surface or the previously deposited silicon carbide layer may be any gas effective to generate radicals suitable for hydrogen abstraction and may optionally be delivered to the substrate in a mixture with an inert carrier gas. Examples of suitable plasma gases include gases containing hydrogen atoms and gases containing $CH_3$ substituents.

The various gases for the deposition process may be pulsed into a deposition chamber containing the substrate through an inlet, through a gas channel or from a variety of holes or outlets which connect to a central channel in fluid communication with the deposition chamber. Different gases may be sequentially pulsed through a single central channel or the deposition chamber may be configured with multiple channels to allow sequential introduction of gases through separate channels. The initial plasma activation of the substrate surface, introduction of vapor phase carbosilane precursor and the subsequent silicon carbide layer activating plasma may each be sequentially pulsed into the deposition chamber in this manner. Purge gases introduced to the deposition chamber between reaction steps may also be introduced through a single central channel or through any one of multiple channels. The channel(s) may be in fluid communication with a showerhead through which the gases enter the deposition chamber.

In some embodiments, a plasma system and processing chambers or systems which may be used in the methods described herein for depositing or forming silicon carbide materials include the TXZ® CVD, chamber available from Applied Materials, Inc., located in Santa Clara, Calif. Additional plasma systems and processing chambers are described in commonly assigned U.S. Pat. Nos. 5,846,332, 6,079,356, and 6,106,625. In other embodiments, a PE-ALD processing chamber or system which may be used in methods described herein for depositing or forming silicon carbide materials is described in commonly assigned U.S. Ser. No. 12/494,901, filed on Jun. 30, 2009, published as United States patent application publication number 20100003406. An ALD processing chamber used in some embodiments described herein may contain a variety of lid assemblies. Other ALD processing chambers may also be used in certain of the embodiments described herein and are available from Applied Materials, Inc., located in Santa Clara, Calif. A detailed description of an ALD processing chamber may be found in commonly assigned U.S. Pat. Nos. 6,878,206, 6,916,398, and 7,780,785. In another embodiment, a chamber configured to operate in both an ALD mode as well as a conventional CVD mode may be used to deposit silicon carbide materials is described in commonly assigned U.S. Pat. No. 7,204,886. In yet another embodiment, dual-channel systems suitable for use in the present methods for deposition of silicon carbide layers on substrate surfaces are disclosed in United States patent application publication number 20070277734 A1 and as described further below.

In the ALD process the processing chamber or the deposition chamber may be pressurized, generally within a range of from about 0.01 Torr to about 80 Torr. Specifically, the pressure of the deposition chamber may be from about 0.1 Torr to about 10 Torr and more specifically from about 0.5 Torr to about 5 Torr. The chamber and/or the substrate may also be heated to a temperature of less than about 600° C., for example to less than about 500° C. or less than about 200° C., at a temperature between room temperature (about 23° C.) and about 200° C. or at about 100° C.

An exemplary embodiment of a PE-ALD process employing the carbosilane precursors herein described is illustrated in FIG. 1. FIG. 1 shows the process wherein the carbosilane precursor is 1,3,5-trisilacyclohexane and the substrate is treated to produce unsaturation on the surface for reaction with the precursor. It is to be understood that any carbosilane precursor represented by the formula $Si_xC_yH_z$ wherein each of x, y and z is at least 1 and the compound contains at least one carbon bridging at least two silicon atoms may be substituted in the reaction illustrated in FIG. 1 and that the plasma-treated surface may contain active sites other than or in addition to the Si=C double bonds shown, including Si=Si double bonds, dangling Si bonds, dangling C bonds, nitrogen inserted into Si—H bonds and nitrogen inserted into Si—Si bonds. All such reactive sites on the substrate surface will react with the carbosilane precursor to bind the precursor to the substrate surface. Similarly, FIG. 1 as an example illustrates a PE-ALD reaction wherein the substrate is also silicon carbide. Again, it is to be understood that other silicon-containing substrate surfaces may be treated to produce reactive sites such as unsaturation and dangling bonds appropriate for binding the precursor to the surface, including silicon or silicon oxide.

In FIG. 1, an exemplary silicon carbide substrate surface is treated with a plasma such as a hydrogen plasma or an inert gas plasma to produce distortions or defects in the surface due to hydrogen abstraction. These distortions or defects may include reactive surface sites such as dangling Si bonds and dangling C bonds (indicated in FIG. 1 with asterisks). Adjacent dangling bonds may then form reactive unsaturated sites such as Si=Si or Si=C double bonds. Both the dangling bonds and the unsaturated sites produce active sites for reaction with the vapor phase carbosilane precursor. Upon completion of the surface activation step the activating plasma is purged from the system. As illustrated in FIG. 1, an exemplary Si=C surface defect is then exposed to vapor phase 1,3,5-trisilacyclohexane, which may optionally be in a mixture with a carrier gas. Reactive Si—H bonds in the precursor are added across the unsaturated surface groups to link the precursor to the substrate surface, forming a first silicon carbide layer on the substrate. The addition of Si—H bonds to surface defects is favored over the addition of C—H bonds due to their lower activation energy.

To obtain densification of intermediate surface-bound carbosilane-based monolayers to SiC, the substrate surface may be treated with a plasma effective for removing hydrogen atoms. That is, a plasma such as a hydrogen gas plasma, an inert gas plasma (such as He, Ar, etc.), or mixtures thereof is introduced into the system in contact with the first silicon carbide layer to produce hydrogen abstraction in the first silicon carbide layer. Both hydrogen atoms and radical species generated in such plasmas are particularly efficient and selective at combining with hydrogen atoms bound to silicon or carbon in the film, which results in the loss of $H_2$ and crosslinking of Si and C. Dangling Si and/or C bonds, as well as Si=Si and/or Si=C double bonds may be formed as reactive sites for a second exposure to vapor phase carbosilane precursor. To produce the second silicon carbide layer, the activating plasma is purged. After purging, the plasma-treated silicon carbide intermediate can be re-exposed to additional carbosilane precursor in gas phase to form an additional adsorbed layer. Reactive Si—H bonds in the precursor are added across the unsaturated groups of the activated carbosilane precursor to link the precursor to the activated silicon carbide layer, forming a second silicon carbide layer. If an SiCN film is desired, an additional plasma step using a gas mixture incorporation nitrogen ($N_2$) can be introduced into the sequence first. Cycles of plasma activation and silicon carbide gas exposure may be repeated until the desired layer thickness is achieved.

Further cycles of hydrogen abstraction (activation) and reaction with the carbosilane precursor can be performed to build a silicon carbide layer of the desired thickness. Although FIG. 1 illustrates repeating deposition cycles with 1,3,5-trisilacyclohexane, it will be understood that a different carbosilane precursor may be employed in one or more subsequent deposition cycles. For example, in a specific embodiment, the precursor may comprise 1,3,5-trisilapentane.

Apparatus and Methods

Another aspect of the invention pertains to apparatus and methods for plasma enhanced atomic layer deposition. In particular embodiments of the second aspect, the apparatus utilizes a showerhead or faceplate with dual channels to deliver a remotely generated plasma through a first set of channels and to deliver precursor and other gases through a second set of channels. The apparatus and methods described Yet another aspect of the invention pertains to a process sequence involving alternating between plasma delivery to a substrate and delivery of precursors to the substrate surface during a cyclical deposition or atomic layer deposition process. The switching between precursor pulses and plasma is performed using a rapid switching process. In one or more embodiments, the ALD process is used to make a metal, metal oxide, nitride, carbide, fluoride or other layer or film on a substrate. In specific embodiments, the rapid switching process can be used to form a SiC layer on a substrate, which can be accomplished by starting with a plasma activation step that induces hydrogen abstraction to generate surface unsaturation. The more reactive Si—H bonds in the next precursor cycle will be added across unsaturated surface groups during the precursor exposure cycle—after which there is a brief purge with an inert carrier gas and the process begins again with the plasma activation step. The plasma gas selected for that process can be any gas effective at generating radicals suitable for H abstraction—particularly in the case in which the plasma is generated remotely behind the faceplate. Alternatively, the plasma can be generated directly between the showerhead and the wafer as a local plasma. The gas mixture delivered throughout the process in both cases can be mixture of an inert carrier gas together with a gas likely to give species effective for H abstraction—which can include H atoms and $CH_3$ substituents.

Thus, specific embodiments of the invention generally provide plasma enhanced atomic layer deposition processes. In one embodiment, silicon carbide deposition is performed using an atomic layer deposition (ALD) process.

Atomic layer deposition is a deposition technique used to form thin films on a substrate, for example, a semiconductor substrate and may be used to form features in the manufacturing process of circuit devices. A thin film is grown layer by layer by exposing a surface of the substrate disposed in a process chamber to alternating pulses of reactants or chemical precursors, each of which undergoes a reaction, generally providing controlled film thickness. Each reactant pulse provides an additional atomic layer to previously deposited layers. In an embodiment, a film growth cycle generally consists of two pulses, each pulse being separated by a purge. The process chamber can be purged with an inert gas to remove the reactant or precursor material. When second reactant or precursor material is pulsed into the reactor, the second reactant or precursor material reacts with the precursor material on the wafer surface. The reactor is purged again with an inert gas. In an ALD manufacturing process, the thickness of the deposited film is controlled by the number of cycles.

Atomic layer deposition may also be referred to as cyclical deposition, referring to the sequential introduction of two or more reactive compounds to deposit a layer of material on a substrate surface. The two or more reactive compounds are alternatively introduced into a reaction zone or process region of a processing chamber. The reactive compounds may be in a state of gas, plasma, vapor, fluid or other state of matter useful for a vapor deposition process. Usually, each reactive compound is separated by a time delay to allow each compound to adhere, adsorb, absorb and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay, a purge gas is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, fluid during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface. Substrates include, without limitation, glass sheets, ceramic substrates and semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

A processing chamber is configured to expose the substrate to a sequence of gases and/or plasmas during the vapor deposition process. The precursors are typically in vapor or gas form. The reactants may be delivered with a carrier gas. A carrier gas, a purge gas, a deposition gas, or other process gas may contain nitrogen, hydrogen, argon, neon, helium, or combinations thereof. Plasmas may be useful for depositing, forming, annealing, treating, or other processing of materials described herein. The various plasmas described herein, such as the nitrogen plasma or the inert gas plasma, may be ignited from and/or contain a plasma reactant gas. The plasma reactant gas may contain nitrogen, hydrogen, argon, neon, helium, or combinations thereof. In some examples, the nitrogen plasma contains nitrogen and hydrogen.

The various gases for the process may be pulsed into an inlet, through a gas channel, from various holes or outlets, and into a central channel. In another embodiment, a film or layer on a substrate may be formed during another PE-ALD process that provides sequential pulses of one or more precursors and plasma (e.g., nitrogen plasma). In these embodiments, the reagents are generally ionized during the process. The PE-ALD process provides that the plasma is generated external from the processing chamber, such as by a remote plasma generator system. During PE-ALD processes, a plasma may be generated from a microwave (MW) frequency generator or a radio frequency (RF) generator.

In some embodiments, a plasma system and a processing chambers or systems which may be used during methods described here for depositing or forming materials include the TXZ® CVD, chamber available from Applied Materials, Inc., located in Santa Clara, Calif. Further disclosure of plasma systems and processing chambers is described in commonly assigned U.S. Pat. Nos. 5,846,332, 6,079,356, and 6,106,625. In other embodiments, a PE-ALD processing chamber or system which may be used during methods described here for depositing or forming materials is described in commonly assigned U.S. Ser. No. 12/494,901, filed on Jun. 30, 2009, published as United States patent application publication number 20100003406. An ALD processing chamber used in some embodiments described herein may contain a variety of lid assemblies. Other ALD processing chambers may also be used during some of the embodiments described herein and are available from Applied Materials, Inc., located in Santa Clara, Calif. A detailed description of an ALD processing chamber may be found in commonly assigned U.S. Pat. Nos. 6,878,206, 6,916,398, and 7,780,785. In another embodiment, a chamber configured to operate in both an ALD mode as well as a conventional CVD mode may be used to deposit materials is described in commonly assigned U.S. Pat. No. 7,204,886.

The ALD process provides that the processing chamber or the deposition chamber may be pressurized at a pressure within a range from about 0.01 Torr to about 80 Torr, for example from about 0.1 Torr to about 10 Torr, and more specifically, from about 0.5 Torr to about 5 Torr. Also, according to one or more embodiments, the chamber or the substrate may be heated to a temperature of less than about 600° C., for example, about 400° C. or less, such as within a range from about 200° C. to about 400° C., and in other embodiments less than about 300° C., less than about 200° C., or less than about 100°, for example in the range of about 50° C. and 100° C., such as in the range of about 70° C. and 90° C.

In specific embodiments, the plasma is a remotely generated plasma delivered through a dual channel showerhead or faceplate. According to one or more embodiments, the remotely generated plasma is delivered through a first set of channels, which are separated from a second set of channels for delivering the precursor. Certain precursors should be separated from the plasma to prevent degradation of the precursor. As noted above, the plasma gas selected for that process can be any gas effective at generating radicals suitable for H abstraction—particularly in the case in which the plasma is generated remotely behind the faceplate. Suitable examples of such gases for the plasma include but are not limited to nitrogen, hydrogen, argon, helium, xenon, and neon.

In specific embodiments, the plasma is a remotely generated plasma delivered through a dual channel showerhead or faceplate. According to one or more embodiments, the remotely generated plasma is delivered through a first set of channels, which are separated from a second set of channels for delivering the precursor. Certain precursors should be separated from the plasma to prevent degradation of the precursor.

Figure 2A:
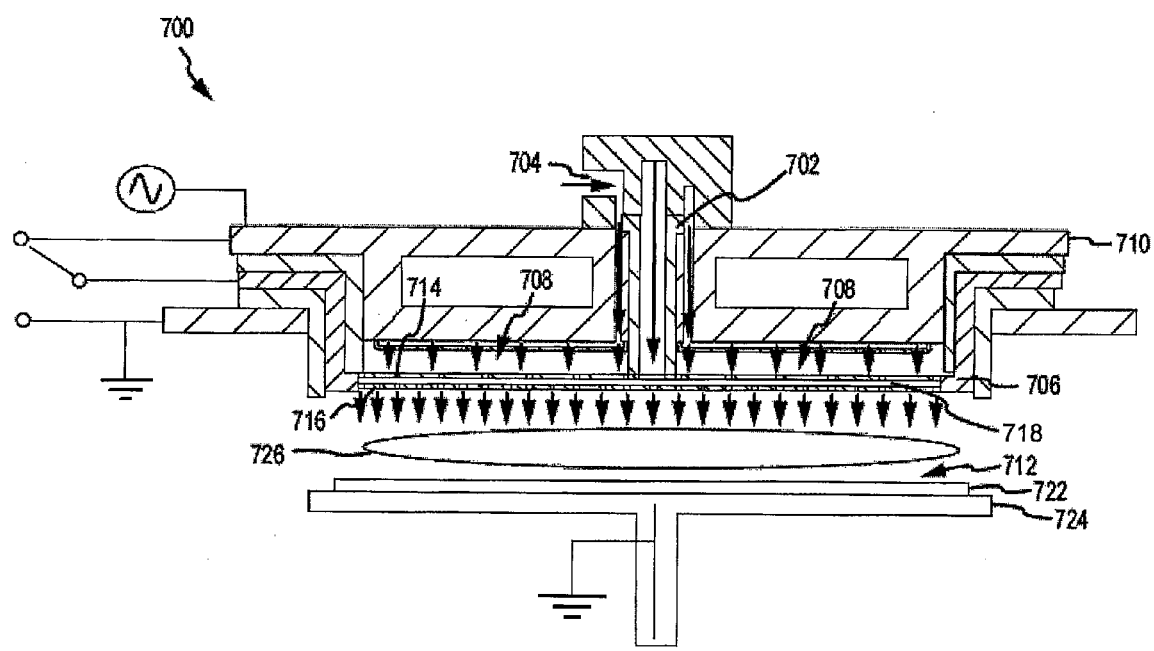
FIG. 2A shows a cross-section of a showerhead and faceplate with independent gas flow channels for use in a ALD process chamber according to one or more embodiments.

Referring now to FIG. 2A, a simplified cross-sectional schematic of a showerhead system 700 is shown. The showerhead 700 is configured with two inlet ports 702 and 704. The first inlet port 702 is coaxial with the center of the showerhead and defines a flow path for at least a first precursor down the center of the showerhead and then laterally behind the faceplate 706. The precursor exits the showerhead into the deposition chamber behind selected openings in the faceplate.

The second inlet port 704 may be configured to flow a plasma gas around the first port 702 and into a region 708 between the gasbox 710 and the faceplate 706. The plasma gas may then flow from region 708 through selected openings in the faceplate 706 before reaching the deposition region 712. As FIG. 2A shows, the faceplate 706 has two sets of openings: a set of first openings 714 that provide fluid communication between the region 708 and the deposition region, and a second set of openings 716 that provide fluid communication between the first inlet port 702, the faceplate gap 718 and the deposition region 712.

The faceplate 706 may be a dual-channel faceplate that keeps the precursor and plasma gas or species independent until they leave the showerhead for the deposition region. For example, the precursors may travel around openings 714 in the faceplate gap 718 before exiting the showerhead through openings 716. Barriers such as a cylindrical port may surround the openings 714 to prevent the precursor from exiting through these openings. Likewise, the plasma gas or species traveling though openings 714 cannot flow across the faceplate gap 718 and out second openings 716 into the deposition region.

In one or more embodiments, the faceplate 706 and pedestal 724 may form electrodes to generate a capacitively coupled plasma 726 in the deposition region above the substrate 722.

The system 700 may also be configured to generate a second plasma 728 in the region 708 behind the face plate. As FIG. 1B shows, this plasma 728 may be generated by applying an RF electric field between the gasbox 710 and the faceplate 706, which form the electrodes for the plasma. This plasma may be made from the plasma gas that flows into region 708 from the second inlet port 704. The second plasma 728 may be used to generate reactive plasma species from the plasma gas.

Figure 2B:
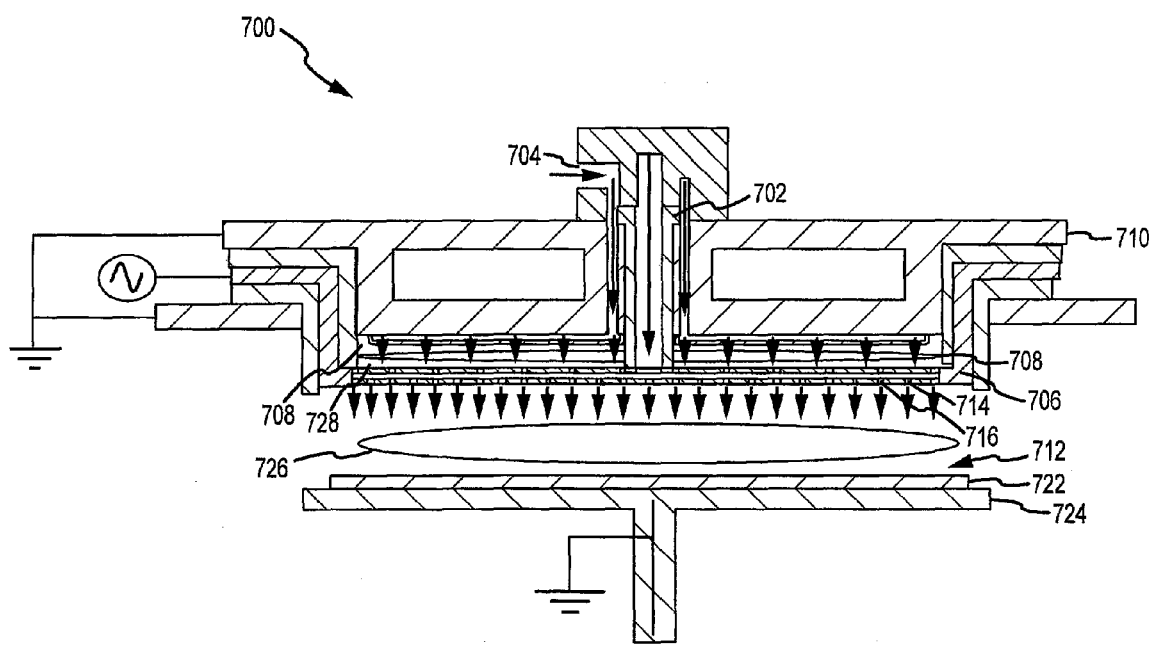
FIG. 2B shows a cross section of a showerhead with independent precursor and plasma gas channels for use in a ALD process chamber according to one or more embodiments.

In FIG. 2B, the faceplate 706 may act as an electrode for both the second plasma 728 and the first plasma 726 in the deposition region. This dual-zone plasma system may employ simultaneous plasmas to generate a plasma species behind the faceplate 706.

Figure 3A:
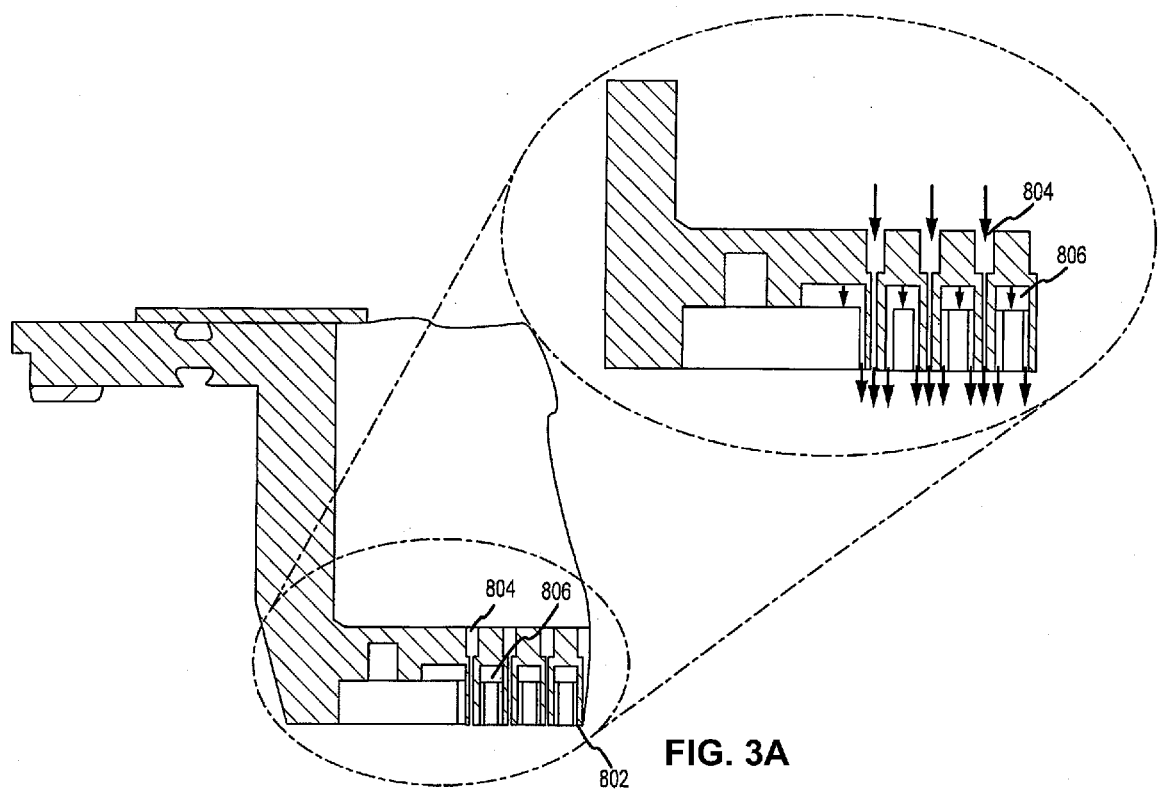
FIG. 3A shows a cross-sectional view portion of a showerhead where process gases are provided through independent channels that include concentric holes in the faceplate for use in a ALD process chamber according to one or more embodiments.
Figure 3B:
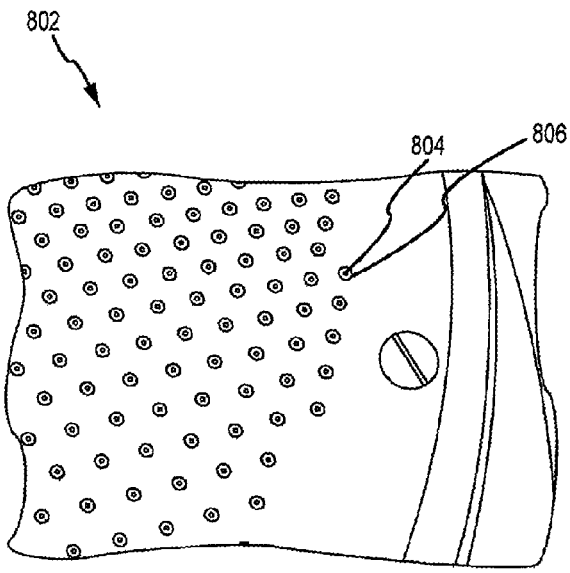
FIG. 3B shows the surface of a faceplate having a concentric hole design for use in a ALD process chamber according to one or more embodiments.
Figure 3C:
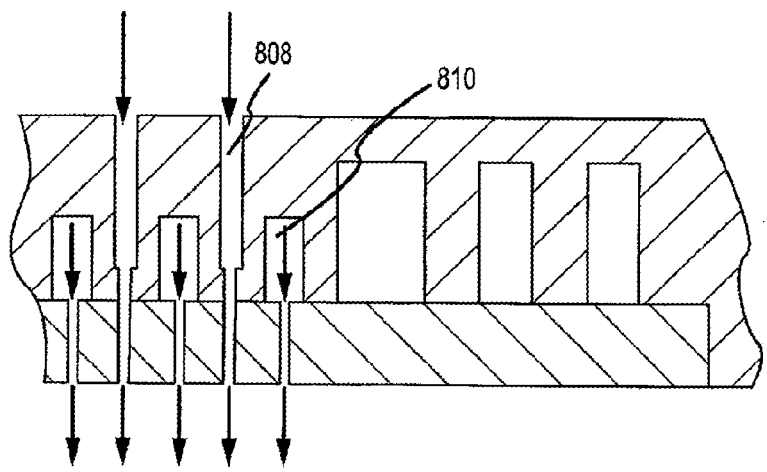
FIG. 3C shows another cross-sectional portion of a showerhead where process gases are provided through independent parallel channels formed in the faceplate.

FIGS. 3A and 3C show two configurations for a first and second set of openings 804 and 806 in a faceplate 802 through which precursors and plasma species may independently flow before reaching a deposition region. FIG. 3A shows a cross-section for a concentric-opening design in which the first set of openings 804 pass a plasma species through a straight conduit while the second set of openings 806 pass a precursor though an concentric annular ring opening that surrounds the first opening. The plasma gas or species and precursor(s) are isolated from each other behind the faceplate and first mix and react when they emerge from the openings 804 and 806 in the deposition region.

FIG. 3B shows of a portion of faceplate 802 that shows an array of first and second opening 804, 806 formed in the faceplate surface. The second annular openings 806 are formed by the gap between the outermost faceplate layer and the tubular walls that define the first openings 804. In the embodiment shown in the picture, the annual gap openings 806 are about 0.003" around the walls of the center openings 804, which are about 0.028" in diameter. Of course, other sizes for the first and second openings may also be used. The plasma species passes through these annular openings 806 and surround the precursor emerging from the center openings 804.

FIG. 3C shows a cross-section for a parallel-opening design in which a first set of openings 808 still creates a straight conduit for a plasma species while a second set of parallel adjacent openings 810 provide an independent flow channel for a precursor. The two sets of openings are isolated from each other so the plasma species and precursor(s) do not mix and react until exiting the showerhead into the reaction region.

Figure 3D:
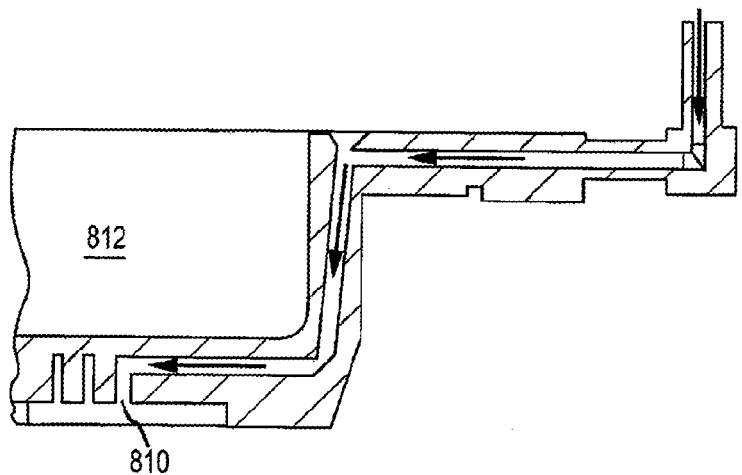
FIG. 3D shows a cross-sectional portion of a showerhead that flows a process gas from the edge to the center of the showerhead for use in a ALD process chamber according to one or more embodiments.

The precursor exiting the openings 810 may flow from an edge region of the showerhead to the center as shown in FIG. 3D. The channel formed between the precursor source and the openings 810 is fluidly isolated from the plasma species flowing from region 812 though openings 808 into the deposition region. The precursor may be provided by one or more fluid channels formed in and/or around the periphery of the showerhead.

The showerhead and faceplate configurations shown above with respect to FIGS. 2A-B and 3A-D can be utilized in an atomic layer deposition system including a process chamber, a RF generator for generating a plasma, a gas panel including a suitable array of gas sticks for a variety of gases to be used in ALD processes (for example, $SiO_2$ and SiN and SiC), ALD valve/solenoids to enable fast switching of precursors, purge and plasma, RF match and a programmable logic controller or other suitable control to implement an ALD control strategy to enable a process sequence in which a plasma gas is flowed, a plasma is struck (the RF generator and match in communication with the controller) and precursor is flowed in a cyclic manner to provide a cyclical deposition/atomic layer deposition process.

Figure 4:
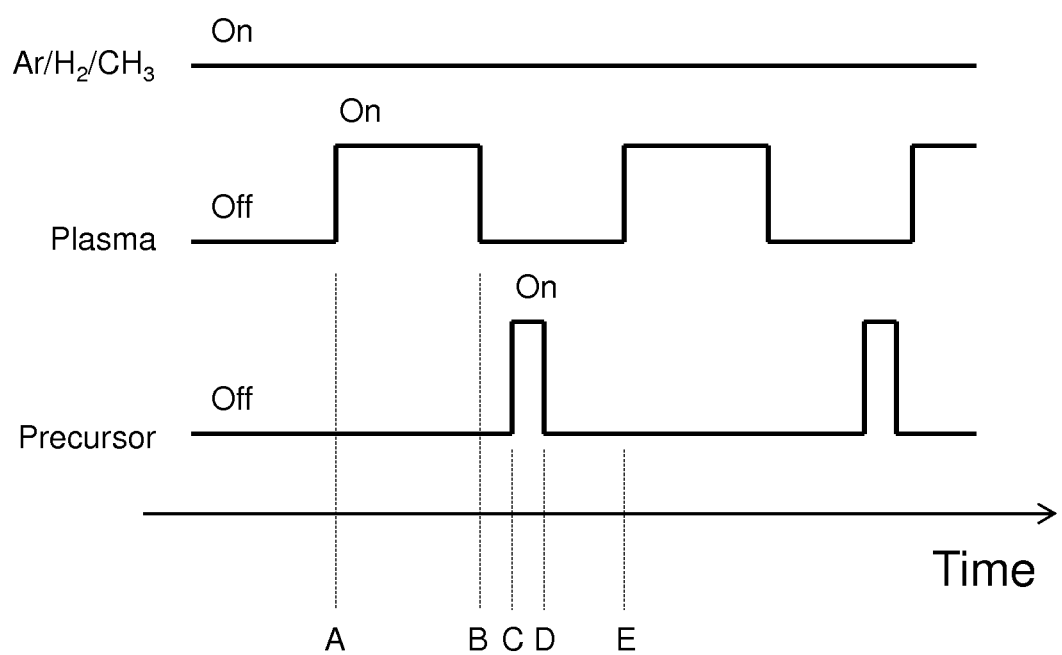
FIG. 4 shows an exemplary process sequence according to one or more embodiments.

With reference to FIG. 4, an exemplary embodiment of an atomic layer deposition process cycle for forming silicon carbide will now be described. In detailed embodiments, plasma gas (for example, Ar, $H_2$ or other gas) is allowed to flow continuously. The rate of flow of the purge gas may be changed over the course of the deposition process and can be halted entirely.

Preparation of Substrate

An optional process step involves preparation of a substrate which has been treated with a plasma or other suitable surface treatment to provide active sites on the surface of the substrate. Referring to FIG. 4, the plasma is ignited (or introduced to the deposition chamber) at time point A and is turned off (or the flow is cut off) at time point B. Examples of suitable active sites include, but are not limited to, —H terminated and —OH terminated active sites.

Delivery of Precursor Gas to Substrate Surface

A substrate having active sites can be exposed to a precursor gas for forming silicon carbide. Still referring to FIG. 4, the first precursor gas can be introduced to the deposition chamber at time point C and cut off at time point D. There is generally a period of time between the plasma and the precursor gas to allow the purge gas to remove any unreacted species and by-products from the deposition chamber. The length of time of the gap can be varied depending on the specific reactions involved. In specific embodiments, the precursor gas is as described above for forming SiC (for example, 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane.) or vapor formed by passing a carrier gas (for example, nitrogen or argon) through an ampoule of the precursor. The ampoule may be heated. The precursor gas can be delivered at any suitable flow rate within a range from about 100 sccm to about 2,000 sccm, for example, from about 200 sccm to about 1,000 sccm, and in specific embodiments, from about 300 sccm to about 700 sccm, for example, about 500 sccm. The substrate may be exposed to the precursor gas for a time period within a range from about 0.1 seconds to about 8 seconds, for example, from about 1 second to about 5 seconds, and in a specific example, from about 2 seconds to about 4 seconds. The flow of the precursor gas can be stopped once the reactant gas species is adsorbed on the substrate.

Purge

The substrate and chamber may be exposed to a purge step after stopping the flow of the reactant gas. This purge begins at time point D on FIG. 4 and extends until the time point E where the substrate may again be subjected to a plasma. A purge gas may be administered into the processing chamber with a flow rate within a range from about 100 sccm to about 2,000 sccm, for example, from about 200 sccm to about 1,000 sccm, and in a specific example, from about 300 sccm to about 700 sccm, for example, about 500 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 2 seconds to about 4 seconds. The carrier gas, the purge gas, the deposition gas, or other process gas may contain nitrogen, hydrogen, argon, neon, helium, or combinations thereof. In one example, the carrier gas contains nitrogen. The cycle can be repeated as shown in FIG. 4.

EXAMPLES

Example 1

Three SiCN films were deposited using 1,3,5-trisilapentane using the conditions listed in the Table 1. Films 1, 2, and 3 were formed using multistep PECVD deposition and treatment-type sequences, with very low powers (20 W) and short times (0.25 sec) used in the first step. This very low power and short exposure time formed 3-4A of a "seed" layer per cycle. Upon completion of this first step, the flow of the 1,3,5-trisilapentane precursor was turned off. A flow of inert gases was continued until residual traces of the precursor were purged from the process chamber. Once purge was completed, gas flows were readjusted and stabilized at the values selected for the first plasma treatment step and again for a second plasma treatment step as indicated in Table 1. After completion of the full sequence, the entire cycle was then repeated until a desired film thickness was reached, for which the measurements reported here was at least 100 A and more generally 200 A thick.

Films 1, 2, and 3 differed in respect to the plasma densification and nitrogenation steps employed. Film 2 was deposited in the same manner as Film 1, but also featured exposure to a He/Ar plasma. Film 3 was deposited in the same manner as Film 2, but featured a nitrogen plasma at 100 W, instead of the 200 W used for Films 1 and 2. Table 1 also shows the elemental composition of all three films deposited at the various conditions determined using Rutherford backscattering. It should be noted that in this particular case analysis of the films for hydrogen content was not performed, though there was likely residual hydrogen remaining behind in the films. Most relevant for comparisons to data on films derived from the precursor HMDS described in Example 2 are C:Si and N:Si ratios which can be calculated independent of the H content. Because 1,3,5-trisilapentane contains no nitrogen, all of the nitrogen incorporated into films derived from 1,3,5-trisilapentane can be attributed to the presence of nitrogen gas added during the plasma treatments. The selection of specific treatment conditions provides some means for adjusting the final film composition.

TABLE 1

Elemental Content of Deposited Films
BULK Films

| Element | Film 1: Deposition: 0.25 sec/20 Watt dep Treatments: 1.5 sec $H_2$ plasma at 100 W, 2.10 sec $N_2$ Plasma at 200 W | Film 2 Deposition: 0.25 sec/20 Watt dep Treatments: 1.5 sec $H_2$ plasma at 100 W 2.5 sec He/Ar at 150 W 3.5 sec $N_2$ Plasma at 200 W | Film 3 Deposition: .25 sec/ 20 Watt dep, Treatments 1.5 sec $H_2$ plasma at 100 W 2.5 s He/Ar Plasma at 150 W 3.2 sec $N_2$ Plasma at 100 W |
|---|---|---|---|
| Si | 29 | 33 | 33 |
| C | 11 | 12 | 19 |
| N | 56 | 55 | 47 |
| O | 4 | 0 | 0 |
| Ar | 0.3 | 0.3 | 1 |

Approximate (average) thickness of film removed by 5 min exposure to dilute HF and etch raters based on 5 min etch time

| 30 Ang total | 20 Ang total | No significant |
|---|---|---|
| 6 Ang/min | 4 Ang/min | etch |
|  |  | <1 Ang/min |

Etch behavior was determined to be non-linear and, while not wishing to be bound to any particular theory, appears to involve the relatively rapid removal of a thin oxidized surface layer, after which subsequent extended exposure to the etchant has little effect. However, for consistency in comparing results to those of Example 2, rates are reported based on a 5 min etch time in 100:1 HF. Similar behavior was observed using 6:1 BOE (6 parts concentrated $NH_4F$/1 part concentrated HF).

Figure 8A:
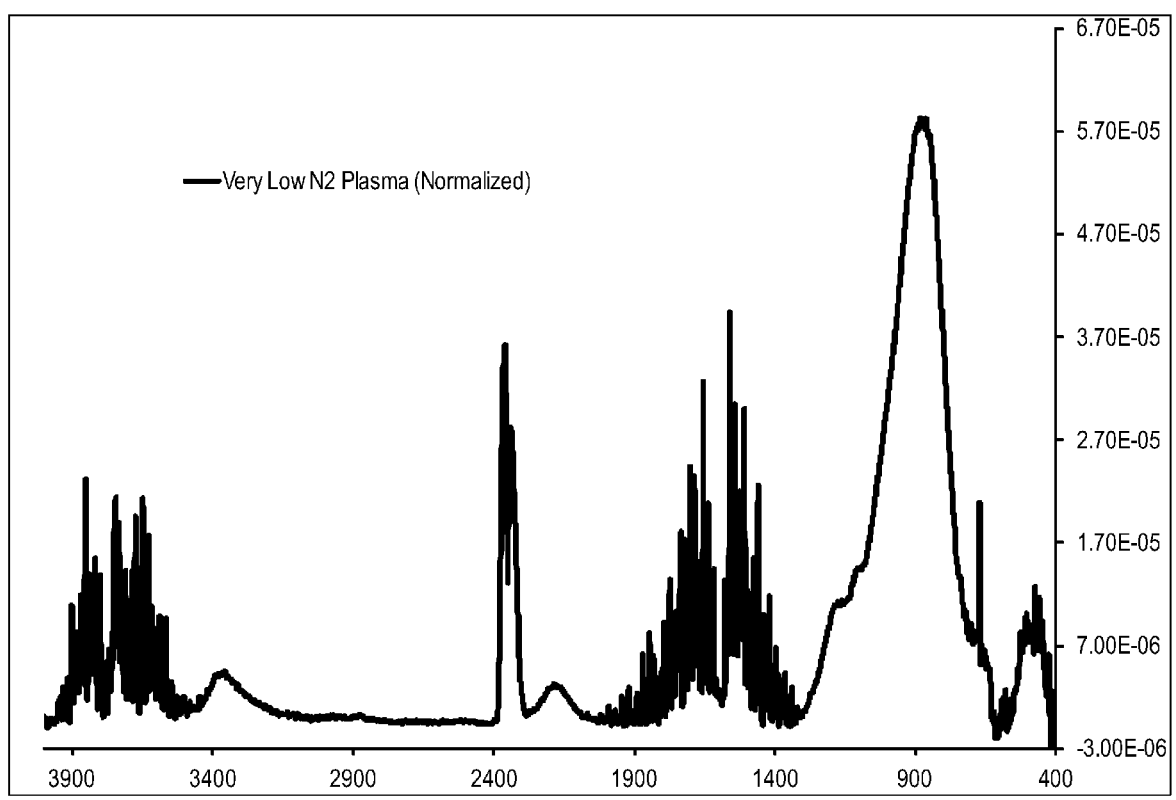
FIGS. 8A-C are Fourier transform infrared spectra of three SiCN films formed in accordance with an embodiment of the invention.
Figure 8B:
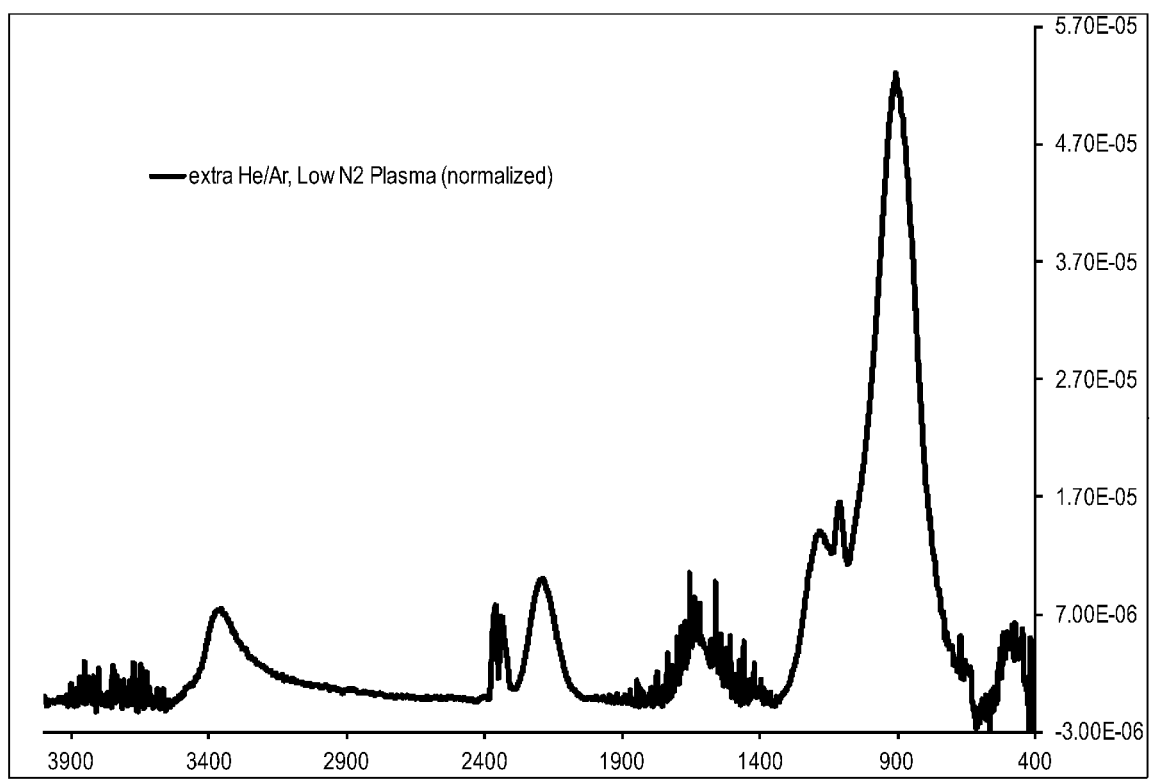
Figure 8C:
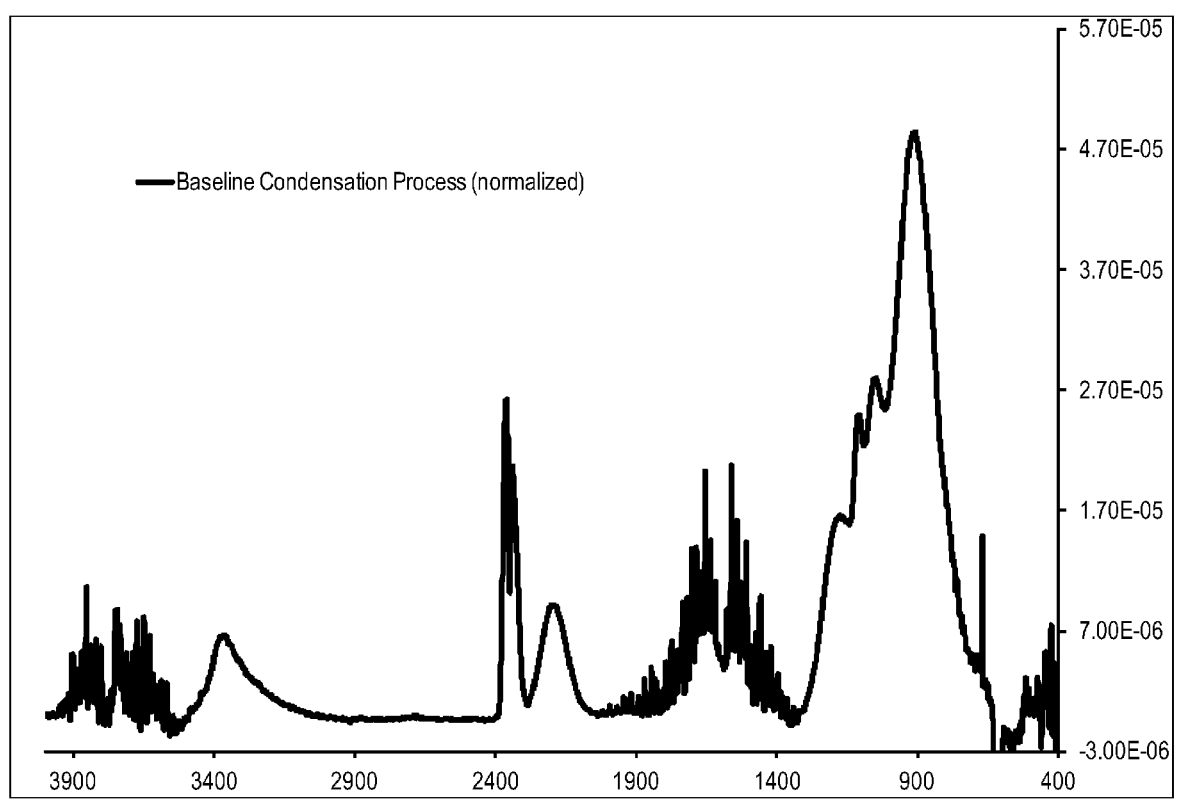

FIG. 8A are graphical representations of Fourier transform infrared (FTIR) spectra of the SiCN films of Example 1. Film 1, which is a typical baseline process condition, is represented FIG. 8C. Film 2 is represented FIG. 8B. Film 3 is represented in FIG. 8A. Each of the three datasets was normalized. The peak at about 3300 $cm^{-1}$ corresponds to N—H bonding. The peak at about 2300 $cm^{-1}$ corresponds to $CO_2$ present in ambient air. The broad peak centered at around 900 $cm^{-1}$ corresponds to SiCN and the shift seen from Film 1. The shift seen from films 1 to Film 3 is attributable to increasing carbon content, which also corresponds to their increasing resistance to wet HF etch chemistries.

Example 2 (Comparative)

Additional SiCN films 4 through 6 were deposited using the precursor hexamethyldisilazane (HMDS) which has the formula $[(CH_3)_3Si]_2NH$. Accordingly, HMDS does not contain a carbon atom bridging at least two silicon atoms. HMDS has a 3:1 carbon to silicon ratio, with each silicon atom bound to three methyl substituents and one nitrogen. A series of cyclic depositions analogous used in depositing Films 1 through 3 were employed for the deposition of Films 4, 5, and 6, with results listed in Table 2 below. In each case, a "seed" layer was deposited at 20 W RF, 6 Torr, delivering HMDS from a pressure controlled vapor draw ampoule using Ar carrier gas analogous to conditions employed for 1,3,5-trisilapentane in Example 1. The deposition rate was determined to be approximately linear with total plasma on time/cycle and the initial step followed by a long inert gas purge to remove residual precursor from the chamber. Film 4 was deposited using only a hydrogen plasma treatment cycle. Film 5 was deposited with an $H_2$ plasma followed by a $N_2$ plasma. Film 6 was deposited using plasma comprising a mixture of $H_2$ and $N_2$.

Table 2 also shows the elemental content of Films 4 through 6, as determined by Rutherford backscattering, as well as 100:1 wet HF etch rates. It should be noted that unlike in Films 1 through 3, Rutherford backscattering analysis for Films 4 through 6 included a determination of hydrogen content in the films. Accordingly, direct comparisons between Films 1 through 3 and Films 4 through 6 are limited to ratios of carbon to silicon or nitrogen to silicon.

TABLE 2

Elemental Content of Deposited Films

| | Treatment | | |
|---|---|---|---|
| Element | Film 4 10 sec $H_2$ Plasma at 300 W | Film 5 1.10 sec $H_2$ Plasma at 300 W 2.2 sec $N_2$ Plasma at 100 W | Film 6 7 sec $H_2$ + $N_2$ Plasma at 200 W |
| Si | 25.50% | 26.50% | 32.50% |
| C | 34% | 19% | 0% |
| N | 18.50% | 38.50% | 47.50% |
| O | 0% | 3% | 9% |
| H | 22% | 13% | 11% |
| 100:1 DHF Etch Rate | <1 Ang/min | >20 Ang./min (complete loss or >100 A thick film in 5 min. | >20 Ang./min. (complete loss of >100 A thick film in 5 min. |

Figure 5:
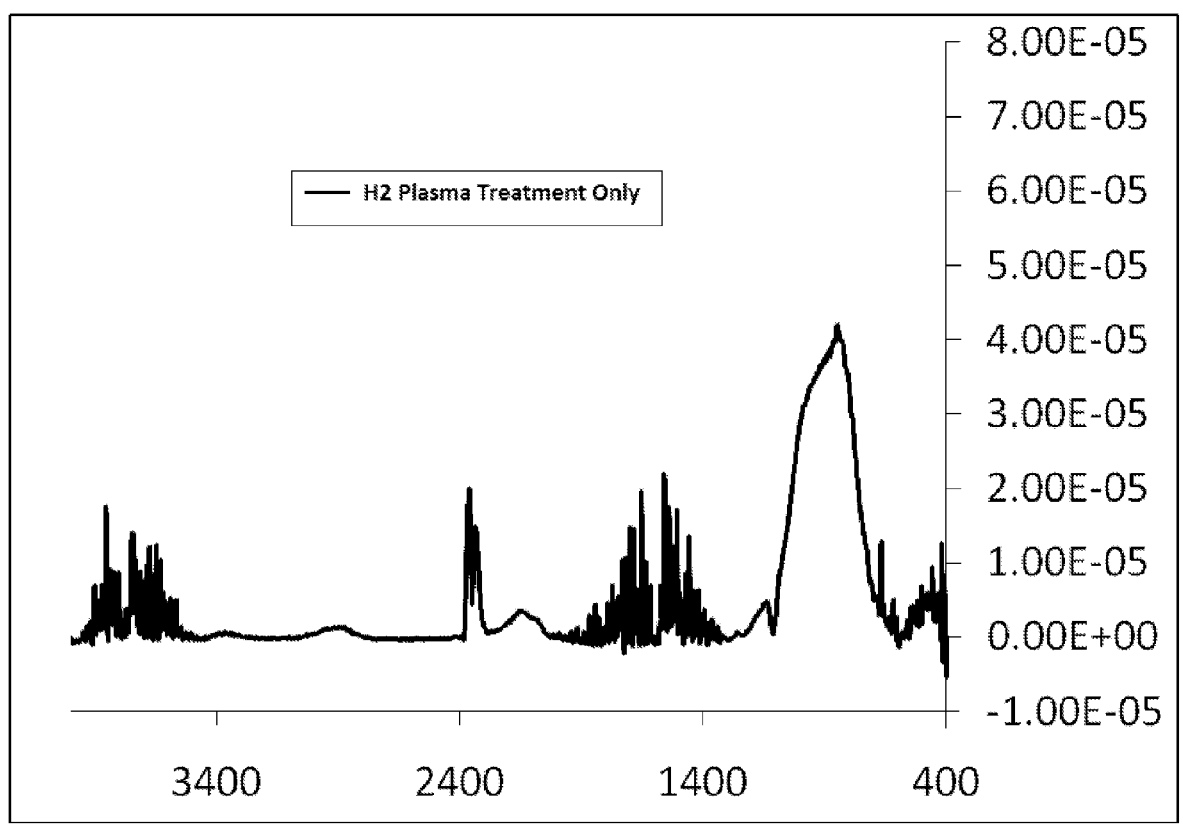
FIG. 5 is a Fourier transform infrared spectra of a comparative SiCN film.
Figure 6:
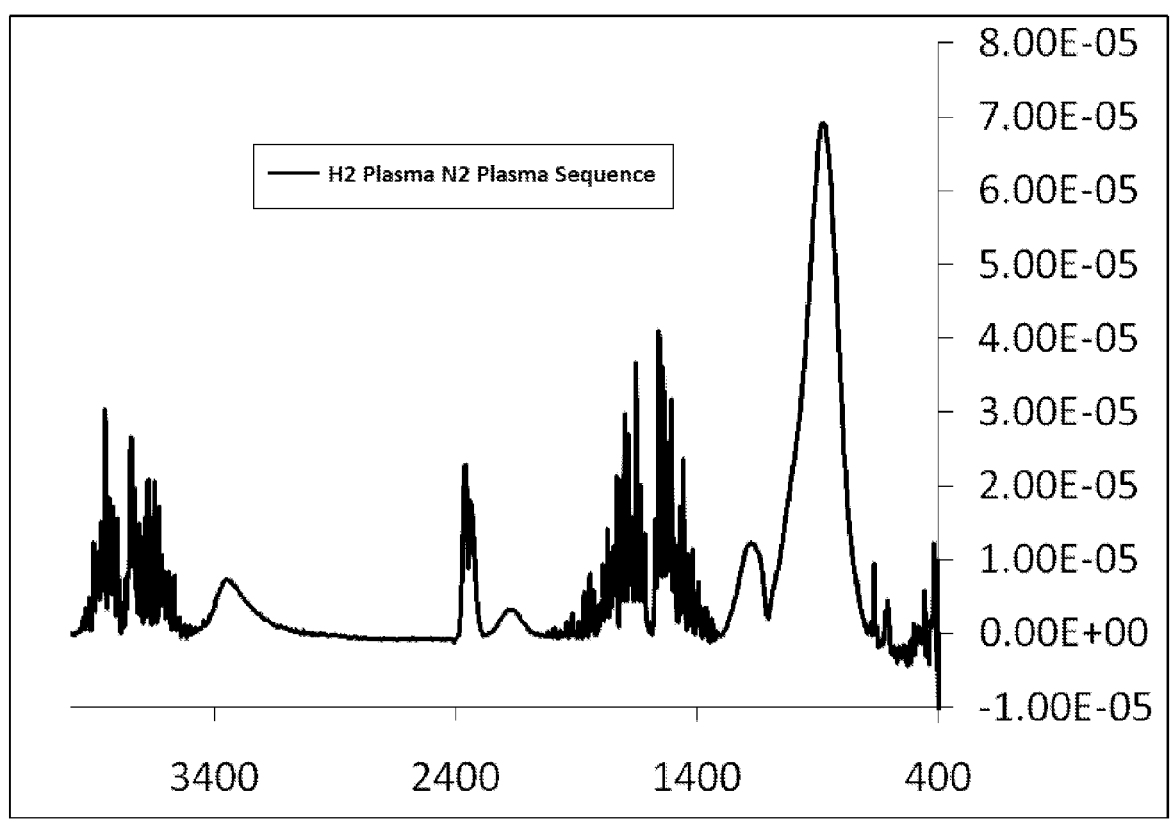
FIG. 6 is a Fourier transform infrared spectra of a comparative SiCN film.
Figure 7:
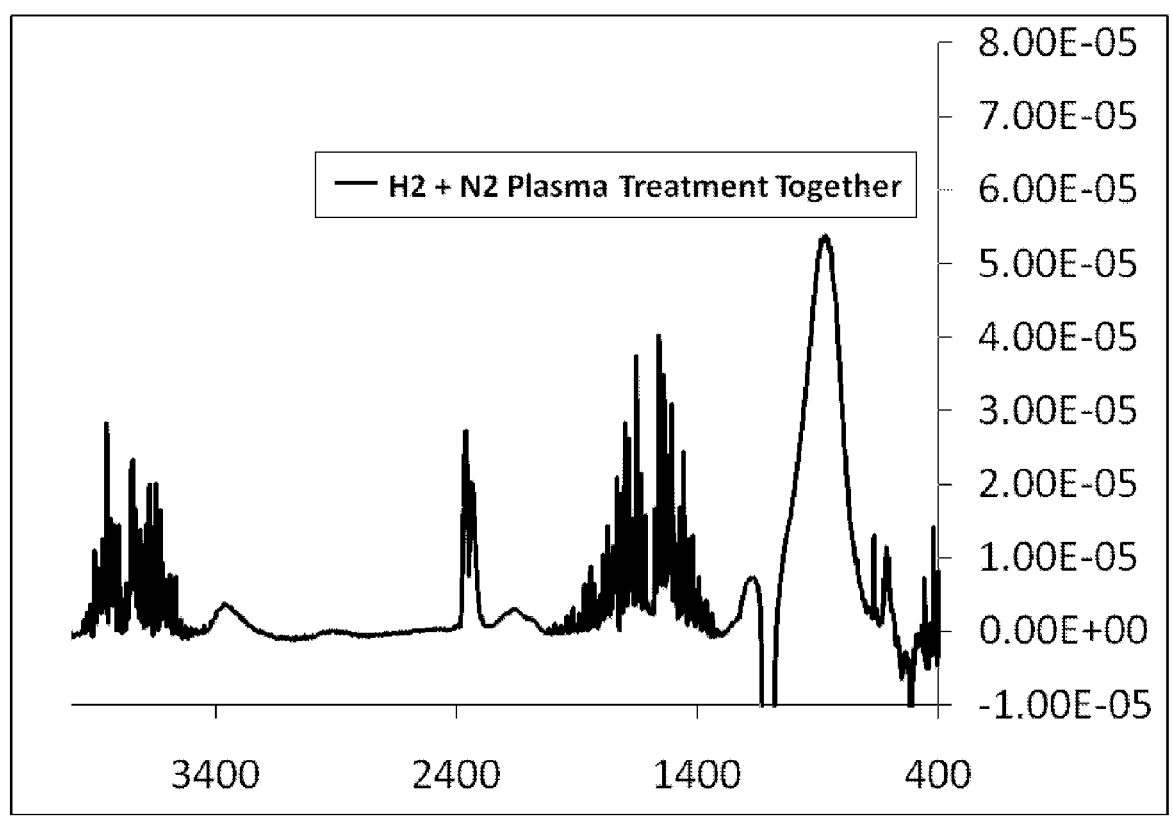
FIG. 7 is a Fourier transform infrared spectra of a comparative SiCN film.

FIGS. 5-7 are graphical representations of Fourier transform infrared (FTIR) spectra of the Films 4 through 6, respectively. The results in FIG. 5 represent deposition followed by the use of a $H_2$ plasma only. The results in FIG. 6 represent deposition using an H₂ plasma followed by an N₂ (in sequence) plasma treatment analogous to that applied in Examples 1. The results in FIG. 7 represent deposition using a plasma comprising a mixture of $H_2$ and $N_2$, and result in complete removal of carbon from the film.

In contrast to the work with 1,3,5-trisilapentane, the conditions necessary to reduce C—H absorptions in the IR spectra and induce growth in the SiCN region at about 800-1000 $cm^{-1}$, were found to result in substantial removal of carbon. In fact, without any additional treatment the C:Si ratio, as determined by RBS, dropped from the initial value of 3:1 to only 1.3:1 While Film 4 was removed slowly in 100:1 HF, the application of additional steps involving a short $N_2$ plasma step (as seen in Film 5 and analogous to those employed in Example 1 films), or an alternative process which combined $H_2$ and $N_2$ plasmas into a single step (as seen in Film 6), underwent significantly higher carbon loss and exhibited low resistance to etching by 100:1 HF.

Interestingly, the $N_2$ plasma step added to each cycle of the process used for Film 4 process to give Film 5 resulted in the C:Si ratio decreasing from 1.3:1 to 0.72:1, with the result still being higher than the ratios between 0.38:1 and 0.58:1 measured for the 1,3,5-trisilapentane-derived Films 1-3. Yet it was the 1,3,5-trisilapentane-derived films which exhibited superior etch resistance.

While not wishing to be bound by any particular theory, these results suggest the bridging carbon atoms present in precursors (and low power seed films derived therefrom) are more effectively retained and converted to etch resistant carbides than carbon originally present in the form of terminal methyl groups. Furthermore, it should be noted that higher RF power levels and longer $H_2$ and/or inert gas plasma treatment times were necessary to promote condensation of HMDS derived seeds to a level approximating the properties of a 1,3,5-trisilapentane-derived films. All the films of Example 1 were prepared using a final Nitrogen plasma step (required for their conversion to SiCN—after which they were shown to still exhibit reasonably high (and useful) resistance to wet HF etch processes. However, applying a similar process in the preparation of Film 5 (derived from the precursor HMDS) resulted in its loss of HF etch resistance—even though the final C:Si ratio remained higher (0.75) than measured in any of the 1,3,5-trisilapentane derived films. It may be concluded that carbon originally present as "bridging" methylenes between Si atoms converts to a form exerting a much greater impact on etch behavior than can be estimated using compositional analysis alone. In the case of the 1,3,5-trisilapentane, the addition of a nitrogen plasma step can effectively incorporate nitrogen without exerting a large effect on the C:Si ratio (dropping from the value of 0.67:1 calculated from the ratio in the precursor to 0.53:1 in the case of Film 3). Adding an analogous Nitrogen plasma step at the end of the densification process used for the HMDS Film 4 resulted in a much more significant impact on carbon content (1.3 dropping to 0.72 together with a severe degradation of etch resistance) suggesting the bonding of the retained carbon in each case is significantly different.

While it may indeed be possible to achieve a process with more classic, self-limiting reactivity by incorporating an active leaving group onto the HMDS molecule (by replacing one of the methyl substituents with a halide or cyanide), the stability of such a precursor may be severely compromised by the potentially reactive, albeit somewhat hindered, N—H bond already present. For this reason precursors possessing both bridging carbon and reactive Si—H bonds (such as 1,3, 5-trisilapentane) are particularly well suited as SiCN precursors, since carbon is efficiently retained while still permitting the introduction of Nitrogen (for example by inserting into Si—H bonds or Si—Si bonds). This results in the creation of reactive functionality not initially present in the precursor itself, thereby enabling use of schemes employing the various "activated" derivatives described herein, most or all of which would not be expected to be viable with an N—H functionality already present in the molecule, as would be the case with a material derived from HMDS.

Therefore, the films of Example 2 show that compositions exhibiting desirable etch properties required much longer and more aggressive $H_2$/inert plasma based densifications steps, after which films were still insufficiently stable to permit use of a nitrogen plasma activation step without significant loss of carbon and etch resistance. This demonstrates the superiority of Example 1 films, deposited according to various embodiments of the invention.

Thus, there is an apparent advantage of precursors such as 1,3,5-trisilapentane (which incorporate carbon in bridging positions between Si atoms) relative to more common precursors possessing non-bridging carbon substituents such as methyl (—CH₃), which is particularly evident when targeting applications requiring that the films exhibit high wet etch resistance to chemistries such as HF (100:1 $H_2O$/concentrated HF), or mixtures such as buffered oxide etch (a mixture on 6:1 concentrated $NH_4F$ to concentrated HF) designed to rapidly etch $SiO_2$.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method for forming a silicon carbide film on a substrate surface comprising exposing a substrate having a reactive surface to a vapor phase carbosilane precursor to form a silicon carbide layer on the substrate surface, wherein the carbosilane precursor contains at least one carbon atom bridging at least two silicon atoms; and treating the silicon carbide layer with a plasma effective to remove hydrogen.

2. The method of claim 1 wherein the carbosilane precursor is 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane.

3. The method of claim 1, wherein the reactive surface is produced by plasma treatment of the substrate.

4. The method of claim 1, wherein the substrate is exposed to the vapor phase carbosilane precursor at a temperature of less than 600° C.

5. The method of claim 4, wherein the substrate is exposed to the vapor phase carbosilane precursor at a temperature between about 23° C. and about 200° C.

6. The method of claim 1, further comprising treating the silicon carbide layer on the substrate surface with a plasma to activate the silicon carbide layer and exposing the activated silicon carbide layer to a second vapor phase carbosilane precursor to form an additional silicon carbide layer on the substrate surface.

7. The method of claim 6, wherein the second vapor phase silicon carbide is different from the silicon carbide in the activated silicon carbide layer.

8. A method of forming a layer on a substrate surface, the method comprising:
exposing the substrate surface to a carbosilane precursor containing at least one carbon atom bridging at least two silicon atoms;
exposing the carbosilane precursor to a low-power energy source to provide a carbosilane at the substrate surface, wherein the carbosilane precursor is exposed to the low-power plasma for about 0.10 seconds to about 5.0 seconds;
densifying the carbosilane; and
exposing the carbosilane surface to a nitrogen source.

9. The method of claim 8, wherein densifying the carbosilane comprises exposing the substrate surface to a plasma containing one or more of He, Ar and $H_2$.

10. The method of claim 8, wherein the carbosilane precursor contains a methylene group bridging at least two silicon atoms.

11. The method of claim 10, wherein the carbosilane precursor is one or more of 1,3-disilapropane, 1,3-disilabutane, 1,3-disilacyclobutane, 1,3,5-trisilacyclohexane, 1,3,5-tisilahexane, 1,3,5-trisilapentane, 1,3,5,7-tetrasilaheptane, and 2,4,6-trisilaheptane.

12. The method of claim 8, wherein exposing the carbosilane to a nitrogen source comprises flowing ammonia or exposing the carbosilane to a plasma containing nitrogen.

13. The method of 12, wherein exposing the carbosilane to a plasma containing nitrogen results in the formation of N—H bonds that promote irreversible attachment of a monolayer of the carbosilane to the substrate surface.

14. The method of claim 8, wherein exposing the carbosilane precursor to a low-power energy source comprises exposing the carbosilane precursor to a low-power plasma, ultraviolet radiation, electron beam or ion beam.

15. The method of claim 8 wherein the low-power plasma has a value of about 10 W to about 200 W.

* * * * *